(12) United States Patent
Lee et al.

(10) Patent No.: US 9,437,612 B1
(45) Date of Patent: Sep. 6, 2016

(54) THREE-DIMENSIONAL MEMORY

(71) Applicant: MACRONIX International Co., Ltd., Hsinchu (TW)

(72) Inventors: Chih-Wei Lee, Hsinchu (TW); Cheng-Hsien Cheng, Hsinchu (TW); Shaw-Hung Ku, Hsinchu (TW); Wen-Pin Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/832,220

(22) Filed: Aug. 21, 2015

(51) Int. Cl.
| | | |
|---|---|---|
| *H01L 29/10* | (2006.01) | |
| *H01L 27/115* | (2006.01) | |
| *H01L 29/16* | (2006.01) | |
| *H01L 29/04* | (2006.01) | |
| *H01L 29/49* | (2006.01) | |
| *H01L 29/51* | (2006.01) | |
| *H01L 23/528* | (2006.01) | |
| *H01L 23/532* | (2006.01) | |
| *H01L 29/06* | (2006.01) | |

(52) U.S. Cl.
CPC ....... *H01L 27/11582* (2013.01); *H01L 23/528* (2013.01); *H01L 23/53271* (2013.01); *H01L 27/11556* (2013.01); *H01L 29/04* (2013.01); *H01L 29/0649* (2013.01); *H01L 29/16* (2013.01); *H01L 29/4916* (2013.01); *H01L 29/518* (2013.01)

(58) Field of Classification Search
CPC ..... H01L 29/16; H01L 29/04; H01L 29/518; H01L 29/0649
USPC ............................................................ 257/66
See application file for complete search history.

(56) References Cited

U.S. PATENT DOCUMENTS

| | | | |
|---|---|---|---|
| 7,575,973 B2 | 8/2009 | Mokhlesi et al. | |
| 7,602,028 B2 | 10/2009 | Son et al. | |
| 2007/0247913 A1 | 10/2007 | Park et al. | |
| 2013/0037860 A1* | 2/2013 | Jang ................. | H01L 27/11519 257/211 |
| 2015/0003157 A1* | 1/2015 | Aritome ............ | G11C 16/0408 365/185.11 |
| 2016/0035789 A1* | 2/2016 | Mine .................. | H01L 27/101 365/148 |

* cited by examiner

*Primary Examiner* — Douglas Menz
(74) *Attorney, Agent, or Firm* — J.C. Patents

(57) ABSTRACT

A three-dimensional memory, which includes memory cell stacked structures. The memory cell stacked structures are stacked by a plurality of memory cell array structures and insulation layers alternatively, and each memory cell array structure includes word lines, active layers, composite layers and sources/drains. The word lines, the active layers and the composite layers extend along a Y direction. The active layers are disposed between the adjacent word lines. The composite layers are disposed between the adjacent word lines and the adjacent active layers, and each composite layer includes a first dielectric layer, a charge storage layer and a second dielectric layer in sequence from the active layers. The sources/drains are disposed in the active layers at equal intervals. A memory cell includes two adjacent sources/drains, the active layer between the two adjacent sources/drains, the first dielectric layer, the charge storage layer and the second dielectric layer on the active layer, and the word lines.

10 Claims, 14 Drawing Sheets

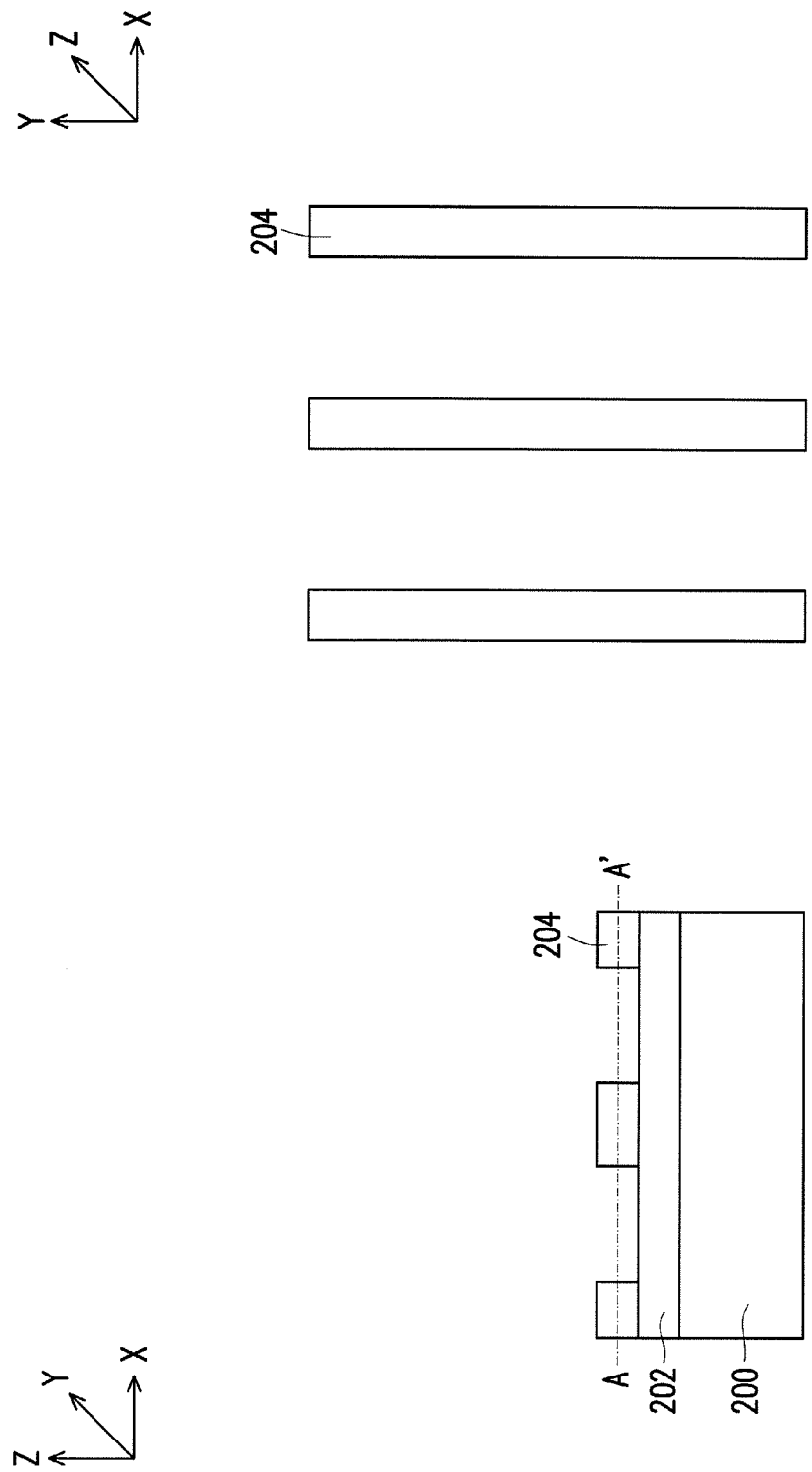

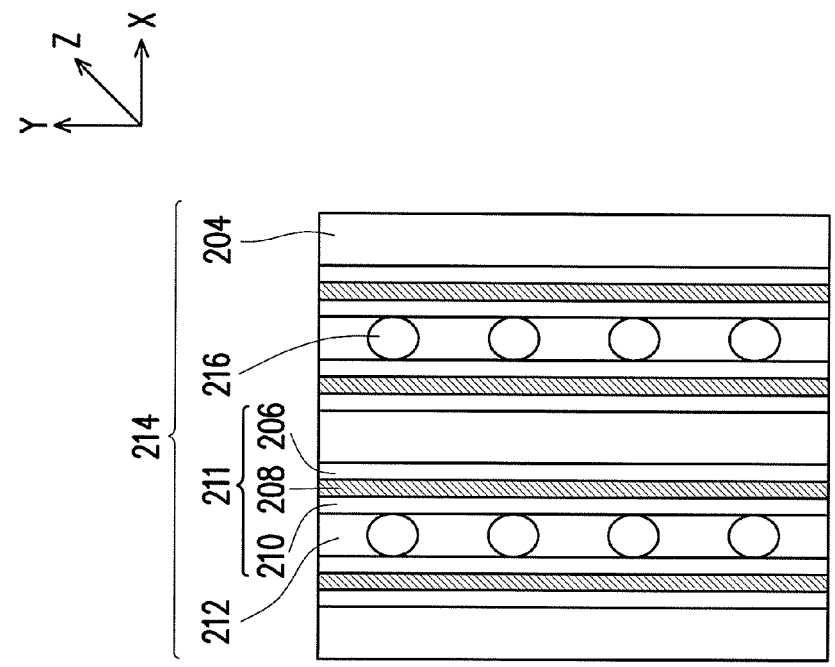
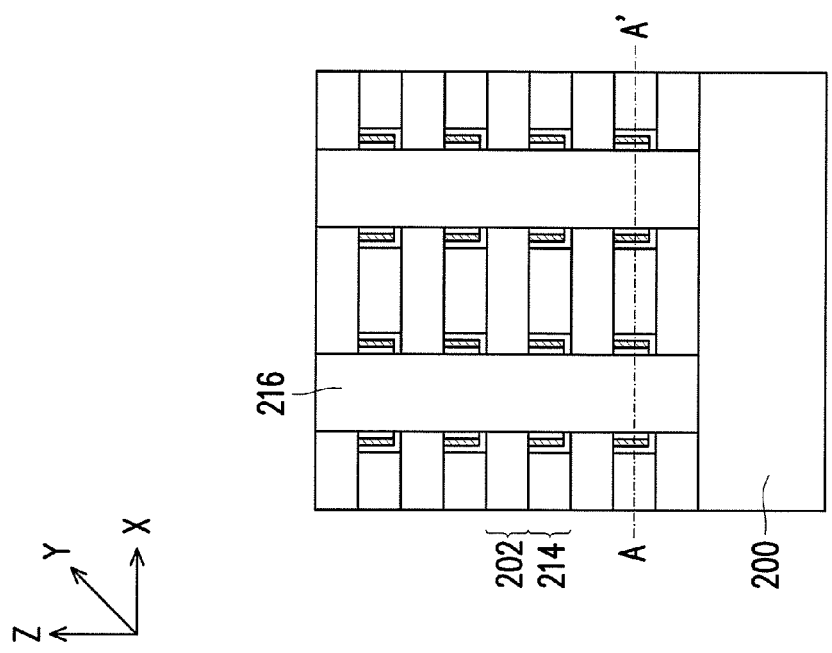
FIG. 4F
FIG. 3F

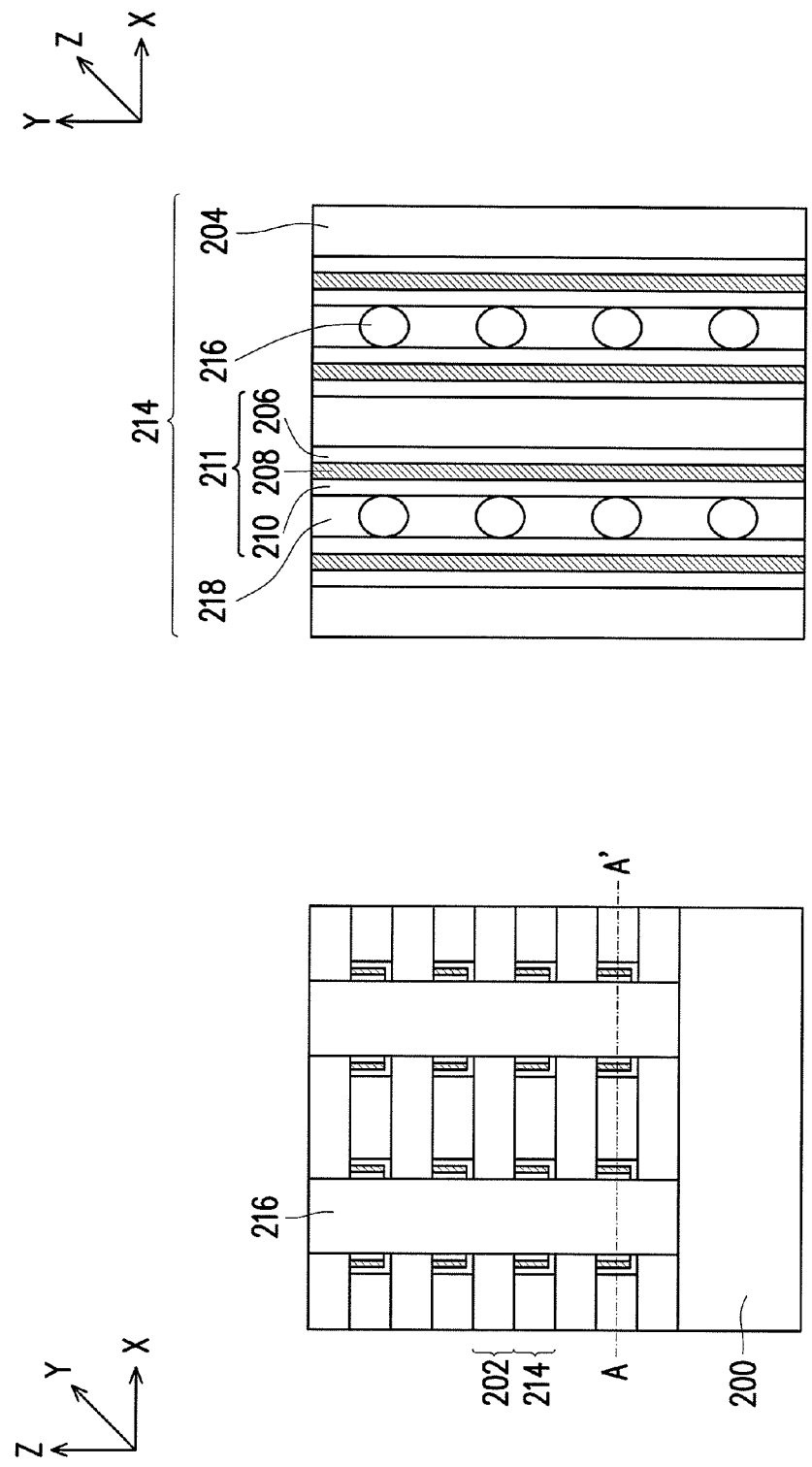

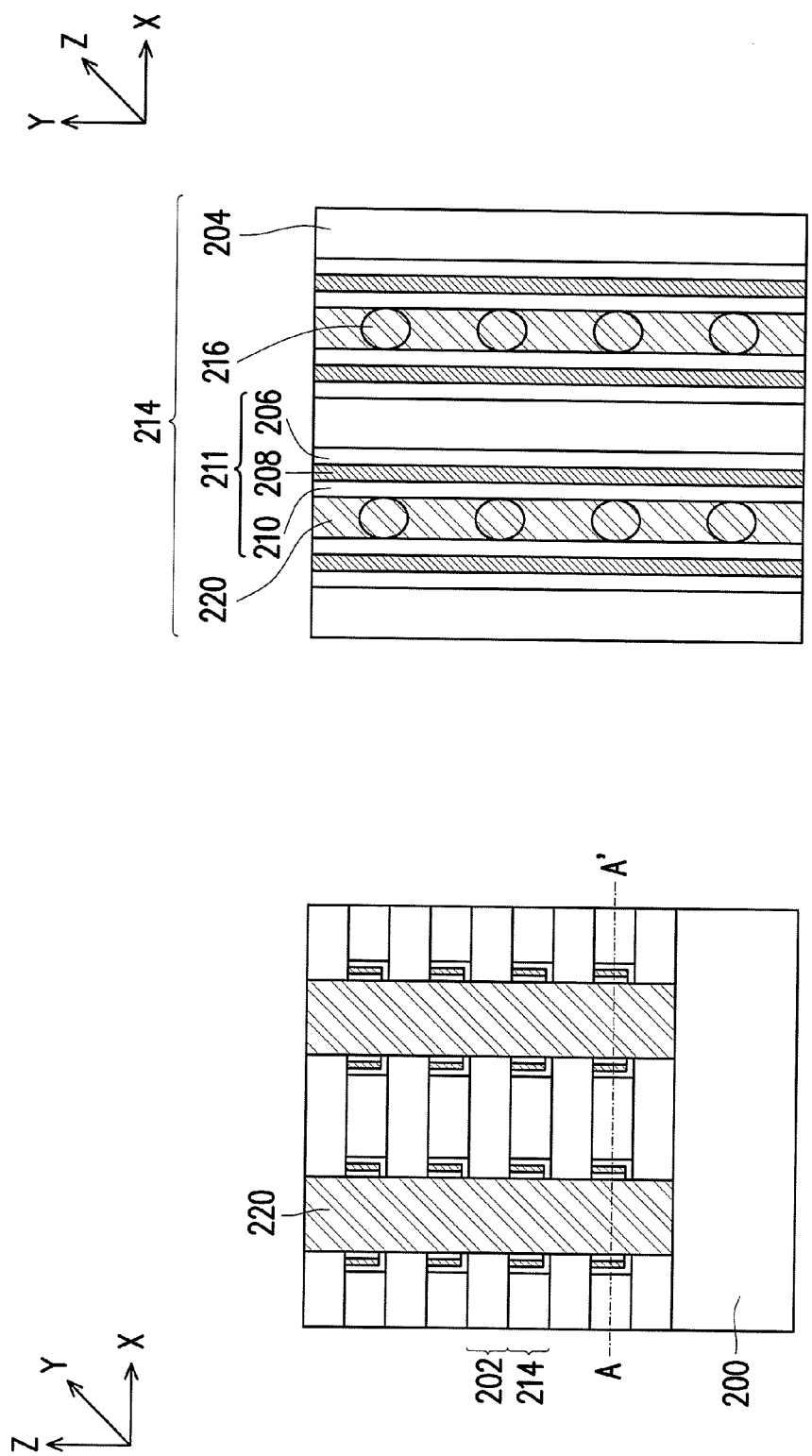

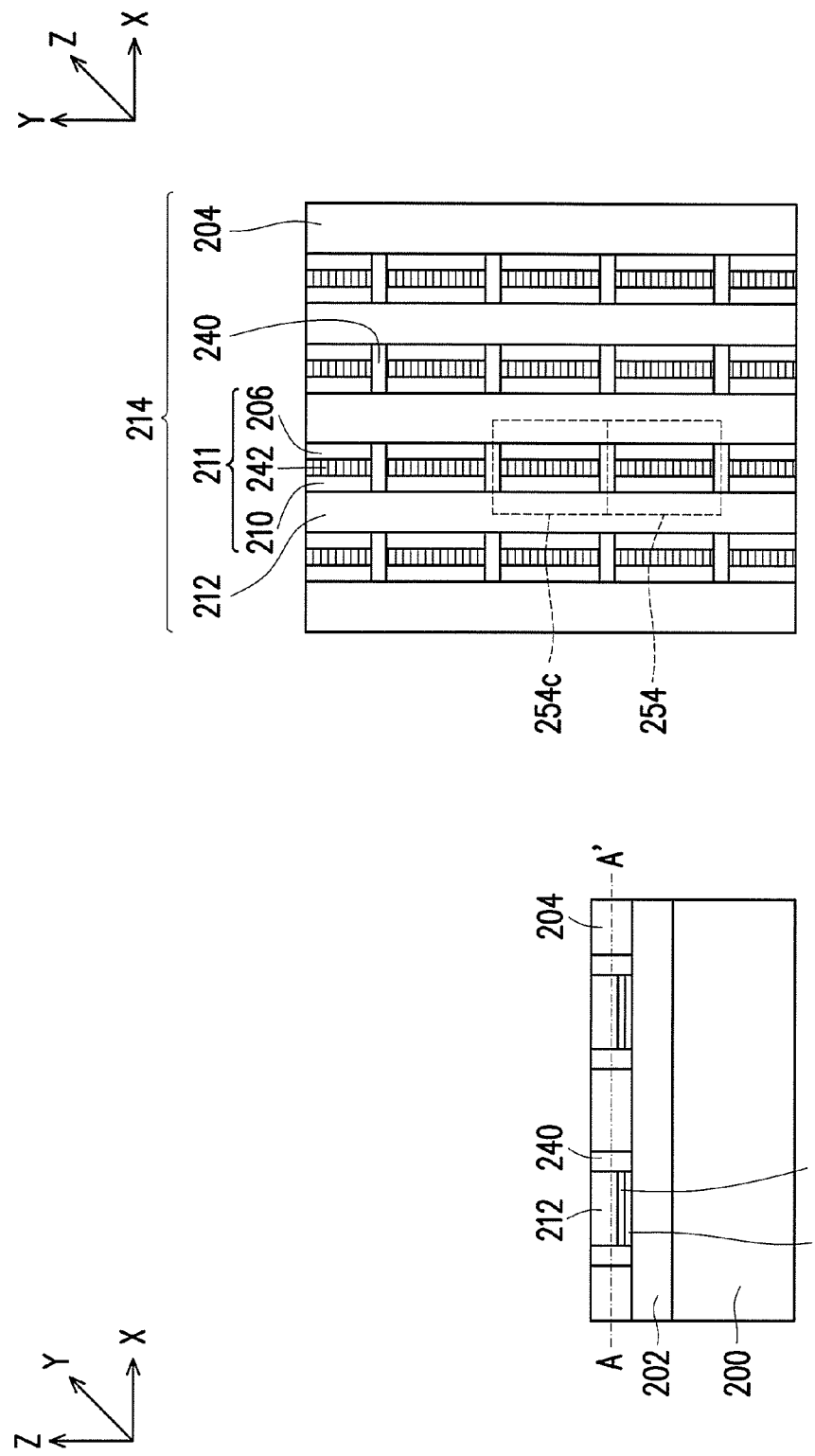

THREE-DIMENSIONAL MEMORY

BACKGROUND OF THE INVENTION

1. Field of the Invention

The present invention generally relates to a semiconductor device, in particular, to a three-dimensional memory.

2. Description of Related Art

As requirements for storage subsystems of consumable products become higher, criterions for read/write speeds or capacities of products have also become higher. Thus, high capacity related goods have become the mainstream in the industry. In view of this, the development of memory has to respond to the needs.

However, so far plane memories, especially NOR memories, are limited by critical dimension of elements in integrated circuits, and miniaturization of storage memory cells has confronted with a bottleneck. Therefore, in order to achieve a greater storage capacity and a lower cost per bit, designers seek for a three-dimensional memory, especially NOR memories, with multiple planes.

SUMMARY OF THE INVENTION

The invention provides a three-dimensional memory, which can elevate an integration of elements.

The invention provides a three-dimensional memory including memory cell stacked structures, wherein the memory cell stacked structures are stacked by a plurality of memory cell array structures and a plurality of insulation layers alternatively. Each memory cell array structure includes a plurality of word lines, a plurality of active layers, a plurality of composite layers, and a plurality of sources/drains. A plurality of word lines extend along a Y direction. A plurality of active layers extend along the Y direction and are disposed between the adjacent word lines. A plurality of composite layers extend along the Y direction and are disposed between the adjacent word lines and the adjacent active layers. Each composite layer includes a first dielectric layer, a charge storage layer and a second dielectric layer in sequence from the active layer. A plurality of sources/drains are disposed in the active layers at equal intervals, and a memory cell includes two adjacent sources/drains, the active layer between the two adjacent sources/drains, and the first dielectric layer, the charge storage layer and the second dielectric layer on the active layer, and the word lines.

According to an embodiment of the invention, the three-dimensional memory further includes a plurality of conductive pillars, extending along a Z direction and electrically connected with the sources/drains in the memory cell stacked structures.

According to an embodiment of the invention, the three-dimensional memory further includes a plurality of bit lines, extending along an X direction and electrically connected with the conductive pillars on the X direction.

According to an embodiment of the invention, the bit lines can include polycrystalline silicon, doped polycrystalline silicon, metal silicide or metal.

According to an embodiment of the invention, the charge storage layers can include silicon nitride.

According to an embodiment of the invention, the charge storage layers can include polycrystalline silicon or doped polycrystalline silicon, and the three-dimensional memory further includes a plurality of isolation layers, disposed in the charge storage layers to isolate the charge storage layers of the adjacent memory cells.

According to an embodiment of the invention, the isolation layers can include silicon oxide.

According to an embodiment of the invention, the word lines and the active layers each can include polycrystalline silicon or doped polycrystalline silicon.

According to an embodiment of the invention, a dopant of the active layers is different from a dopant of the sources/drains.

According to an embodiment of the invention, the sources/drains and the conductive pillars can include polycrystalline silicon, doped polycrystalline silicon, gemianide, metal silicide or metal.

According to an embodiment of the invention, a dopant of the active layers is different from a dopant of the sources/drains.

According to an embodiment of the invention, the first dielectric layers, the second dielectric layers and the insulation layers each can comprise silicon oxide.

According to an embodiment of the invention, in each memory cell stacked structure, two adjacent memory cells share one word line or one active layer and sources/drains on the X direction.

According to an embodiment of the invention, in each memory cell stacked structure, a plurality of the memory cells are connected in series and share one word line on the Y direction.

In view of the above, in the three-dimensional memory of the invention, two adjacent memory cells share one word line, or share one active layer and sources/drains, thus an integration of elements can be elevated.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3I are cross-sectional views illustrating a manufacturing process of a three-dimensional memory according to an embodiment of the invention.

FIG. 4A to FIG. 4I are cross-sectional views taken along the line A-A' of FIG. 3A to FIG. 3I.

FIG. 5A and FIG. 5B are cross-sectional views illustrating a part of a manufacturing process of a three-dimensional memory according to another embodiment of the invention.

FIG. 6A and FIG. 6B are cross-sectional views taken along the line A-A' of FIG. 5A and FIG. 5B.

DESCRIPTION OF THE EMBODIMENTS

Figure 1B:
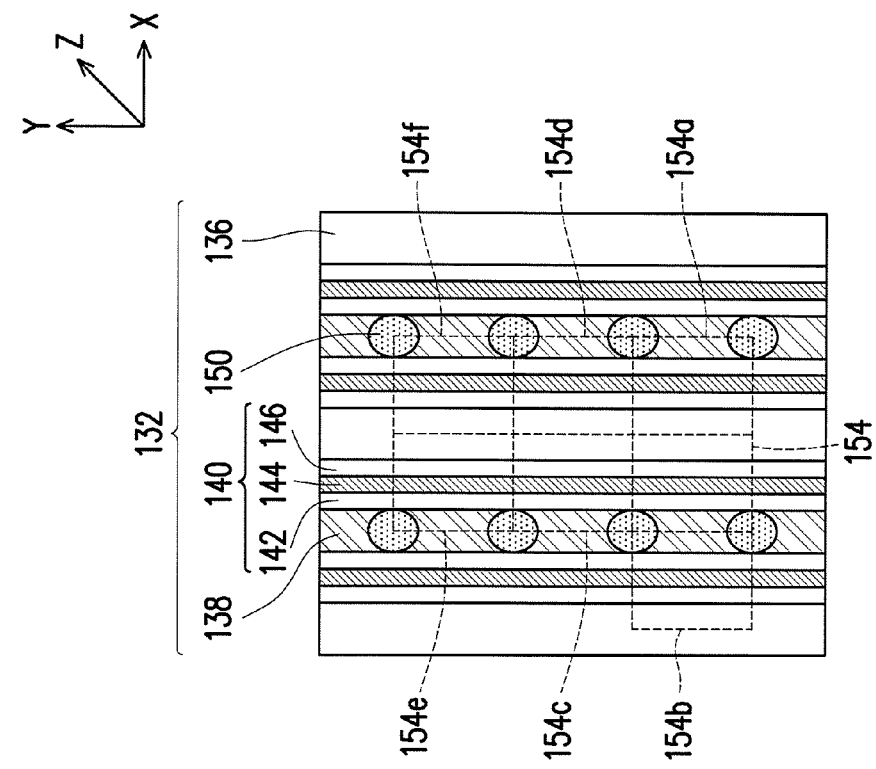
FIG. 1B is a cross-sectional view taken along the line A-A' of FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 1A:
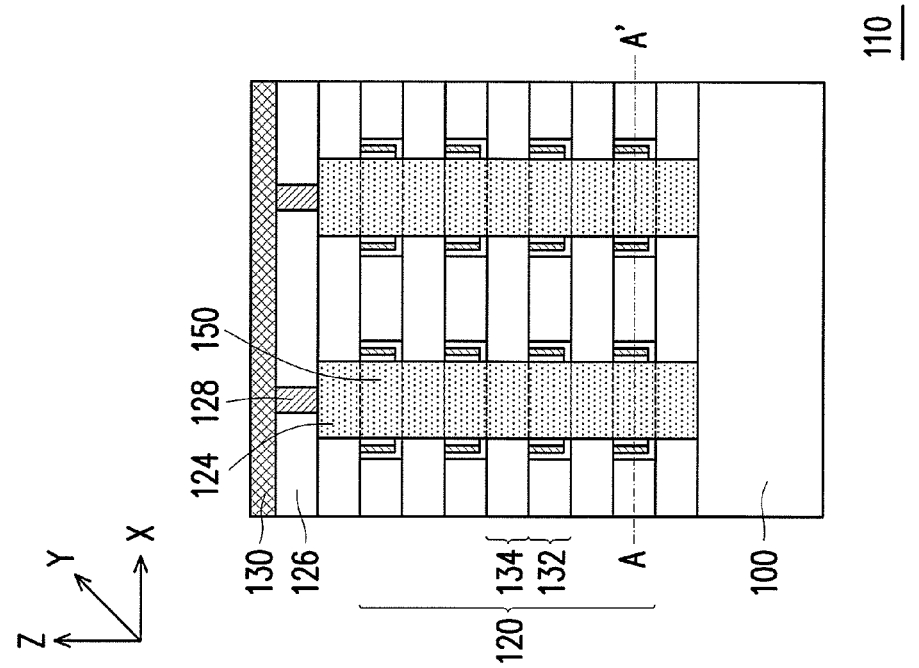
FIG. 1A is a cross-sectional view of a three-dimensional memory according to an embodiment of the invention.
Figure 1D:
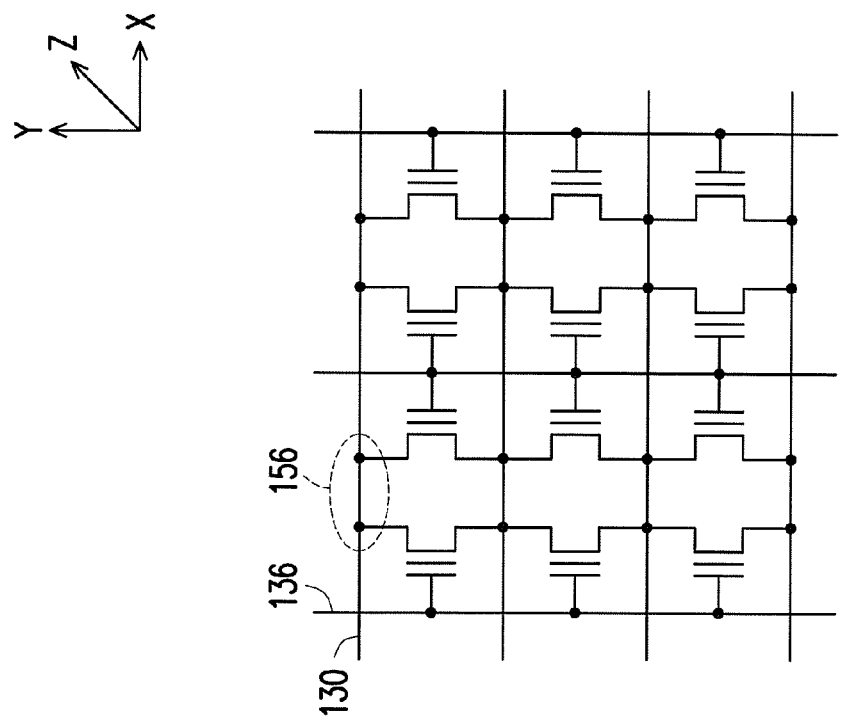
FIG. 1D is a circuit schematic diagram of FIG. 1A.
Figure 1C:
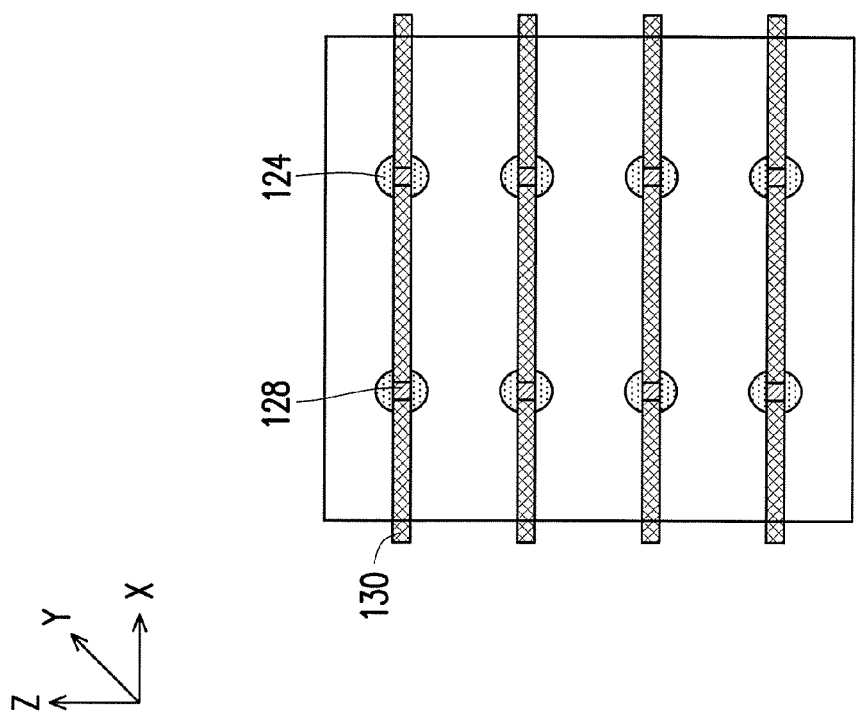
FIG. 1C is a top view of FIG. 1A.

FIG. 1A is a cross-sectional view of a three-dimensional memory according to an embodiment of the invention. FIG. 1B is a cross-sectional view taken along the line A-A' of FIG. 1A. FIG. 1C is a top view of FIG. 1A. FIG. 1D is a circuit schematic diagram of FIG. 1A.

Referring to FIG. 1A and FIG. 1B, a three-dimensional memory 110 includes memory cell stacked structures 120, a plurality of conductive pillars 124, an interlayer insulation layer 126, plugs 128 and a plurality of bit lines 130.

The memory cell stacked structures 120 are stacked by a plurality of memory cell array structures 132 and a plurality of insulation layers 134 alternatively, and each memory cell array structure 132 includes a plurality of word lines 136, a plurality of active layers 138, a plurality of composite layers 140, and a plurality of sources/drains 150.

A plurality of word lines 136, for example, extend along a Y direction, and are disposed to be parallel to each other. The word lines 136 can include a conductive material, such as polycrystalline silicon or doped polycrystalline silicon. The word lines 136, for example, are also control gates of a memory cell.

A plurality of active layers 138, for example, extend along the Y direction, and are disposed to be parallel to each other. The active layers 138 each are disposed between the adjacent word lines 136. The active layers 138 can include a conductive material, such as polycrystalline silicon or doped polycrystalline silicon.

A plurality of composite layers 140, for example, extend along the Y direction, and are disposed to be parallel to each other. The composite layers 140 each are disposed between the adjacent word lines 136 and the adjacent active layers 138. Each composite layer 140 includes a dielectric layer 142, a charge storage layer 144 and a dielectric layer 146 in sequence from the active layer 138.

The dielectric layers 142, for example, extend along the Y direction, and are disposed to be parallel to each other. The dielectric layers 142 can include a dielectric material, such as silicon oxide. The dielectric layers 142 are, for example, tunneling dielectric layers.

The charge storage layers 144, for example, extend along the Y direction, and are disposed to be parallel to each other. The charge storage layers 144 can include a material that can trap electric charges, such as silicon nitride, tantalum oxide, strontium titanate and hafnium oxide. In the embodiment, the material of the charge storage layers 144 is, for example, silicon nitride; while in another embodiment, the material of the charge storage layers 144 includes a conductive material, such as polycrystalline silicon or doped polycrystalline silicon. Detail descriptions will be made later in FIG. 2A and FIG. 2B. The charge storage layers 144 are, for example, floating gates.

The dielectric layers 146, for example, extend along the Y direction, and are disposed to be parallel to each other. The dielectric layers 146 can include a dielectric material, such as silicon oxide, silicon nitride, and silicon oxynitride. The dielectric layers 146 can be a single-layer structure or a multi-layer structure having one or more layers, such as silicon oxide/silicon nitride layers or silicon oxide/silicon nitride/silicon oxide layers. In the embodiment, the material of the dielectric layers 146 is, for example, silicon oxide.

The sources/drains 150 are, for example, disposed in the active layers 138 at equal intervals. The sources/drains 150 can include a conductive material, such as doped polycrystalline silicon, germanide, metal silicide or metal.

A dopant of the active layers 138 is different from a dopant of the sources/drains 150. For example, when the active layers 138 are polycrystalline silicon containing N-type dopant, the sources/drains 150 are polycrystalline silicon containing P-type dopant; and when the active layers 138 are polycrystalline silicon containing P-type dopant, the sources/drains 150 are polycrystalline silicon containing N-type dopant.

A memory cell 154 includes two adjacent sources/drains 150, the active layer 138 between the two adjacent sources/drains 150, the dielectric layer 142, the charge storage layer 144, the dielectric layer 146 on the active layer 138, and the word lines 136.

A plurality of insulation layers 134 are, for example, disposed between the adjacent memory cell array structures 132. The insulation layers 134 can include an insulation material, such as silicon oxide.

Conductive pillars 124, for example, extend along a Z direction and electrically connected with the sources/drains 150 corresponding to each of the memory cell array structures 132 in the memory cell stacked structures 120. The conductive pillars 124 can include a conductive material, such as polycrystalline silicon, doped polycrystalline silicon, germanide, metal silicide or metal.

The interlayer insulation layer 126 is, for example, disposed on the memory cell stacked structures 120. The interlayer insulation layer 126 can include an insulation material, such as silicon oxide, phosphorosilicate glass, boron-phosphorosilicate glass, or other suitable dielectric materials.

Plugs 128 are, for example, disposed in the interlayer insulation layer 126. The plugs 128 can include a conductive material, such as polycrystalline silicon, doped polycrystalline silicon, metal silicide or metal.

A plurality of bit lines 130, for example, extend along an X direction, and are disposed to be parallel to each other. The bit lines 130 are electrically connected with the conductive pillars 124 by the plugs 128. Further, referring to FIG. 1C, the bit lines 130 are electrically connected with the conductive pillars 124 on the X direction. The bit lines 130 can include a conductive material, such as polycrystalline silicon, doped polycrystalline silicon, metal silicide or metal.

Referring to FIGS. 1A to 1D simultaneously, in the memory cell array structures 132, a plurality of memory cells are regularly arranged to form a row/column array. On the X direction, as shown in FIG. 1B, two adjacent memory cells share one word line 136 (such as memory cell 154 and memory cell 154a) or one active layer 138 and sources/drains 150 (such as memory cell 154 and memory cell 154b). Further, on the X direction, as shown in FIG. 1C, the bit lines 130 are electrically connected with the sources/drains 150 on the X direction. On the Y direction, as shown in FIG. 1B, a plurality of the memory cells are connected in series and share one word line (such as memory cell 154b, memory cell 154c and memory cell 154e, and memory cell 154a, memory cell 154d and memory cell 154f). On the Z direction, as shown in FIG. 1A, the conductive pillars are electrically connected with the sources/drains 150 in the memory cell stacked structures 120. The three-dimensional memory 110 is formed through the abovementioned way of electrical connection, as shown in FIG. 1D. In FIG. 1D, for clearly indicating the circuit, a pair of junction points 156 are used to represent the same conductive pillar 124 (sources/drains 150). Through the abovementioned way of electrical connection, an appropriate voltage is applied to corresponding bit lines and word lines under different operation modes to control the three-dimensional memory executing steps such as programming, read, and erasing.

In the three-dimensional memory of the invention, two adjacent memory cells share one word line (such as memory cell 154 and memory cell 154*a* in FIG. 1B) or one active layer and sources/drains (such as memory cell 154 and memory cell 154*b* in FIG. 1B), thus an integration of elements can be elevated.

Figure 2B:
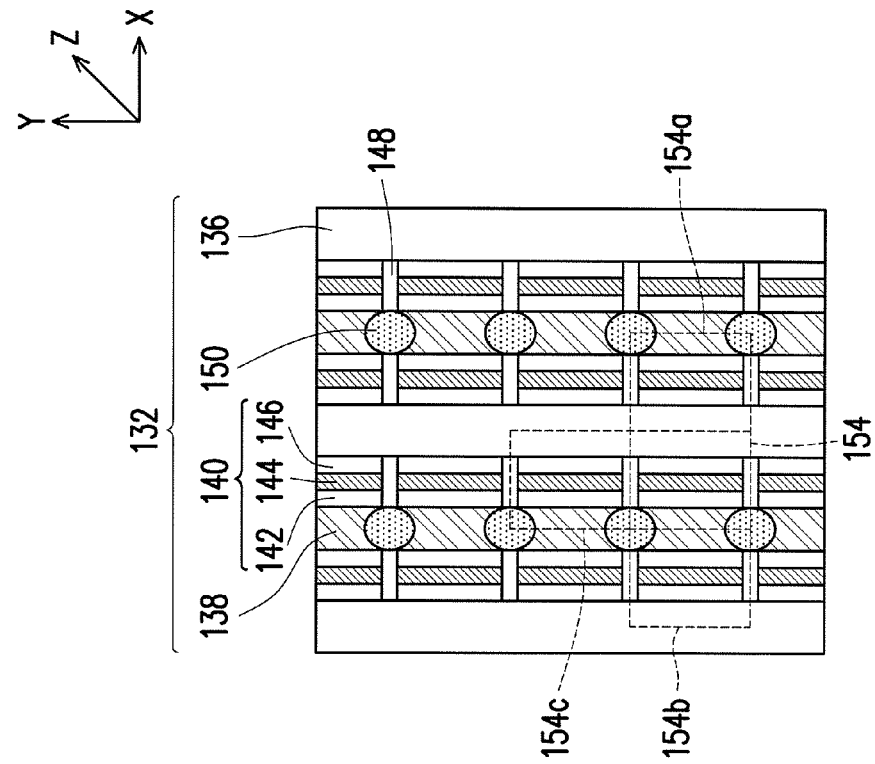
FIG. 2B is a cross-sectional view taken along the line A-A' of FIG. 2A.
Figure 2A:
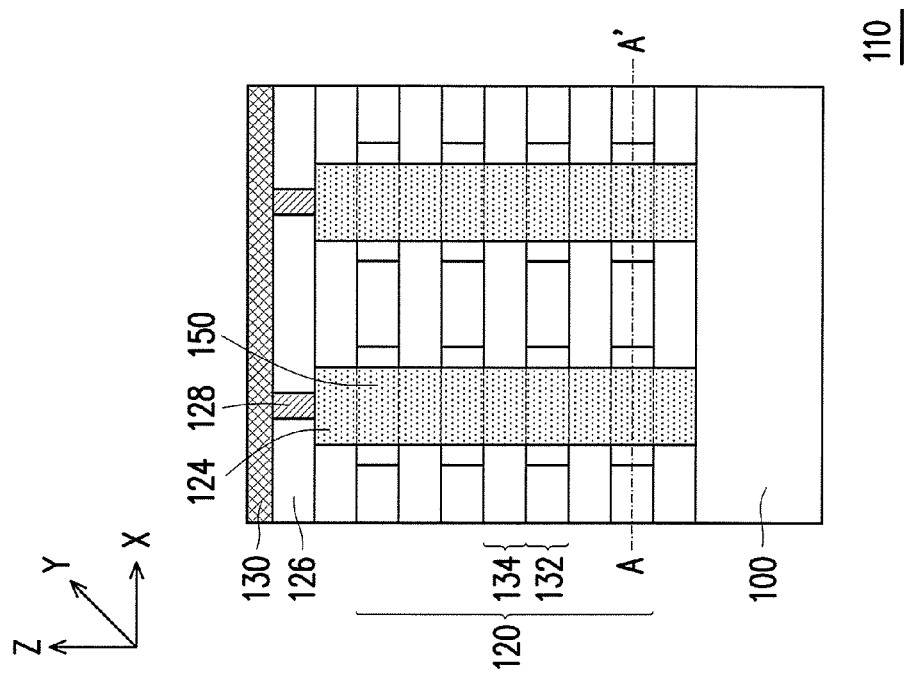
FIG. 2A is a cross-sectional view of a three-dimensional memory according to another embodiment of the invention.

FIG. 2A is a cross-sectional view of a three-dimensional memory according to another embodiment of the invention. FIG. 2B is a cross-sectional view taken along the line A-A' of FIG. 2A.

Referring to FIG. 2A and FIG. 2B, in this embodiment, the charge storage layers 144 can include a conductive material, such as polycrystalline silicon or doped polycrystalline silicon. The three-dimensional memory further includes a plurality of isolation layers 148 disposed in the charge storage layers 144 to isolate the charge storage layers 144 of the adjacent memory cells (such as memory cell 154 and memory cell 154*c* in FIG. 2B) on the Y direction. The isolation layers 148 is, for example, silicon oxide. The rest of the components are the same as those of the abovementioned embodiment.

FIG. 3A to FIG. 3I are cross-sectional views illustrating a manufacturing process of a three-dimensional memory according to an embodiment of the invention. FIG. 4A to FIG. 4I are cross-sectional views taken along the line A-A' of FIG. 3A to FIG. 3I.

Referring to FIG. 3A and FIG. 4A, a substrate 200 is first provided. Then an insulation layer 202 is formed on the substrate 200. The insulation layer can include an insulation material, such as silicon oxide. The insulation layer 202 is, for example, formed with a chemical vapour deposition (CVD) process.

Next, a word line 204 is formed on the insulation layer 202. The word line 204 can include a conductive material, such as polycrystalline silicon or doped polycrystalline silicon. The word line 204 is, for example, formed by the following steps. A conductive layer (not shown) is formed on the insulation layer 202, then the word line 204 is formed by a photolithography and etching process. The conductive layer is, for example, formed with a CVD process.

Figure 4B:
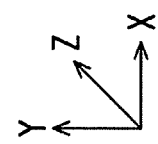
Figure 4B:
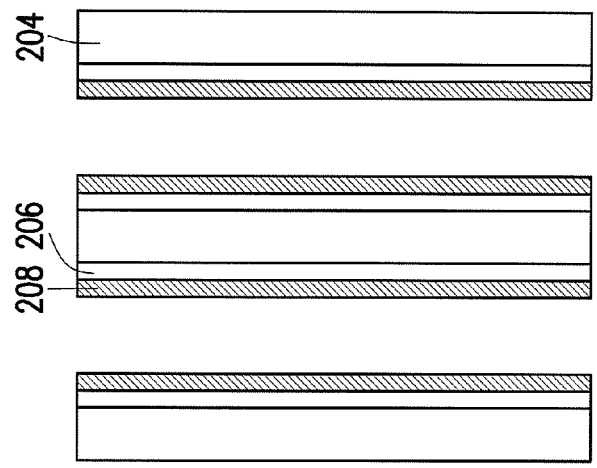
Figure 3B:
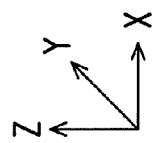
Figure 3B:
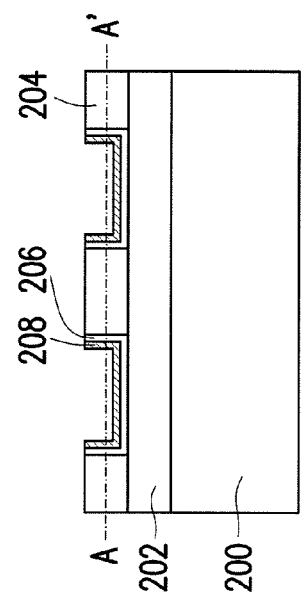

Referring to FIG. 3B and FIG. 4B, a dielectric layer 206 and a charge storage layer 208 are sequentially formed at least on a side wall of the word line 204. The dielectric layer 206 can include a dielectric material, such as silicon oxide, silicon nitride, and silicon oxynitride. The dielectric layer 206 can be a single-layer structure or a multi-layer structure having one or more layers, such as silicon oxide/silicon nitride layers or silicon oxide/silicon nitride/silicon oxide layers. In the embodiment, the material of the dielectric layer 206 is, for example, silicon oxide. The charge storage layer 208 can include a material that can trap electric charges, such as silicon nitride, tantalum oxide, strontium titanate and hafnium oxide. In the embodiment, the material of the charge storage layer 208 is, for example, silicon nitride; while in another embodiment, the material of the charge storage layer 208 includes a conductive material, such as polycrystalline silicon or doped polycrystalline silicon. Detail descriptions will be made later in FIG. 5A to FIG. 6B. The dielectric layer 206 and the charge storage layer 208 are, for example, formed by the following steps. A dielectric material layer (not shown) and a trapping material layer (not shown) covering the insulation layer 202 and the word line 204 are sequentially formed on the substrate 200. Next, the dielectric material layer and the trapping material layer on the word line 204 are removed to expose the word line 204 and form the dielectric layer 206 and the charge storage layer 208. The dielectric material layer and the trapping material layer are, for example, formed with a CVD process. The dielectric material layer and the trapping material layer on the word line 204 are, for example, removed by a chemical polishing mechanical (CMP) process.

Figure 4C:
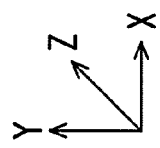
Figure 4C:
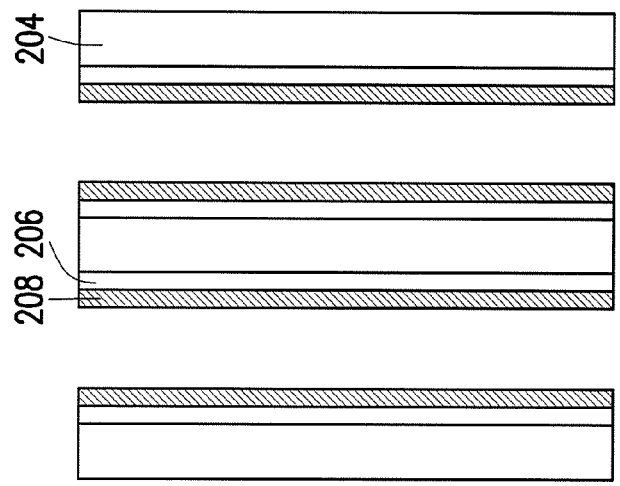
Figure 3C:
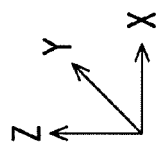
Figure 3C:
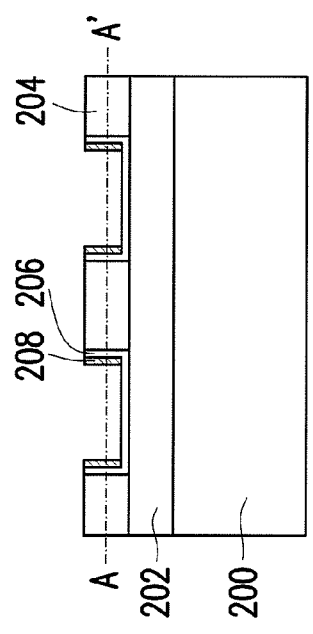

Referring to FIG. 3C and FIG. 4C, the charge storage layer 208 on the dielectric layer 206 between the word lines 204 is removed. The charge storage layer 208 on the dielectric layer 206 between the word lines 204 is, for example, removed by a dry etching process.

Figure 4D:
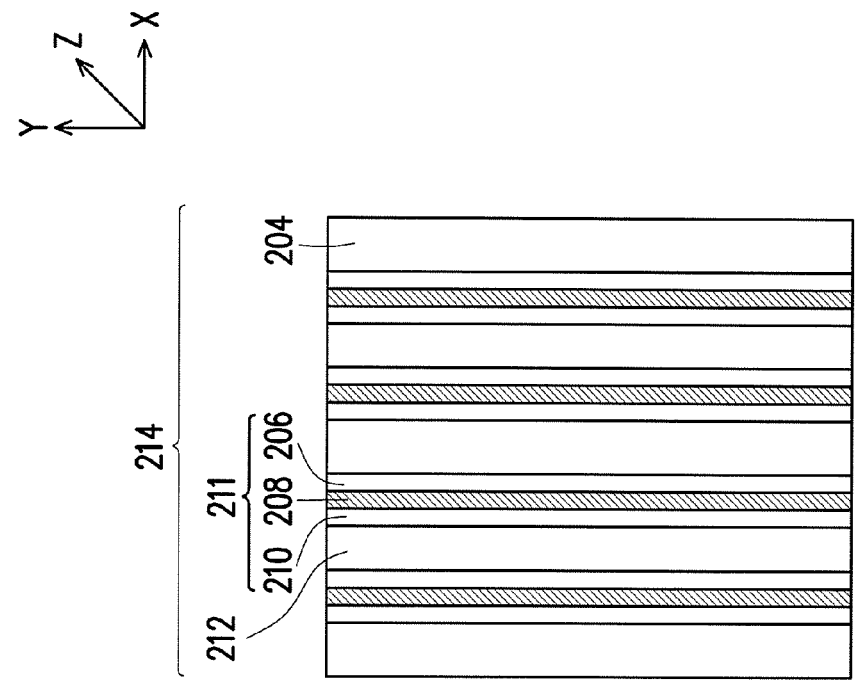
Figure 3D:
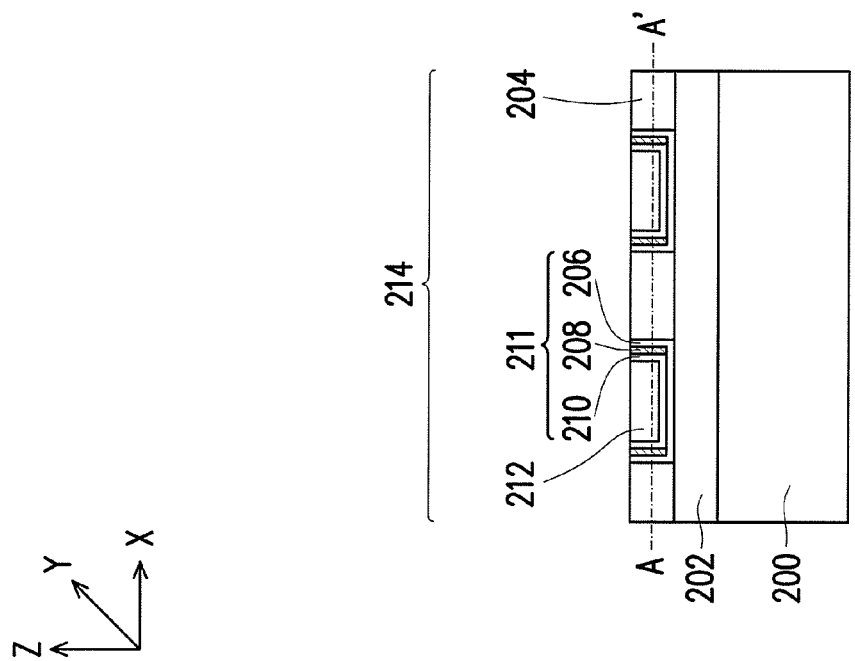

Referring to FIG. 3D and FIG. 4D, a dielectric layer 210 is formed at least on a side wall of the charge storage layer 208, and a sacrificial layer 212 is formed on the dielectric layer 210 between the word lines 204. The dielectric layer 210 can include a dielectric material, such as silicon oxide. The sacrificial layer 212 must have sufficient etching selectivity to the insulation layer 202 and the dielectric layer 210, and no other specific limit is required. In the embodiment, the sacrificial layer is, for example, silicon nitride. The dielectric layer 210 and the sacrificial layer 212 are, for example, formed by the following steps. A dielectric material layer (not shown) and a sacrificial material layer (not shown) covering the word line 204, the dielectric layer 206 and the charge storage layer 208 are sequentially formed on the substrate 200. Next, the dielectric material layer and the sacrificial material layer on the word line 204 are removed to expose the word line 204 and form the dielectric layer 210 and the sacrificial layer 212. The dielectric material layer and the sacrificial material layer are, for example, formed with a CVD process. The dielectric material layer and the sacrificial material layer on the word line 204 are, for example, removed by a CMP process.

By now, a stacked layer 214 is aimed on the insulation layer 202. The stacked layer 214 includes: a word line 204, a composite layer 211 and a sacrificial layer 212. The composite layer 211 includes a dielectric layer 210, a trapping 208 and a dielectric layer 206.

Figure 4E:
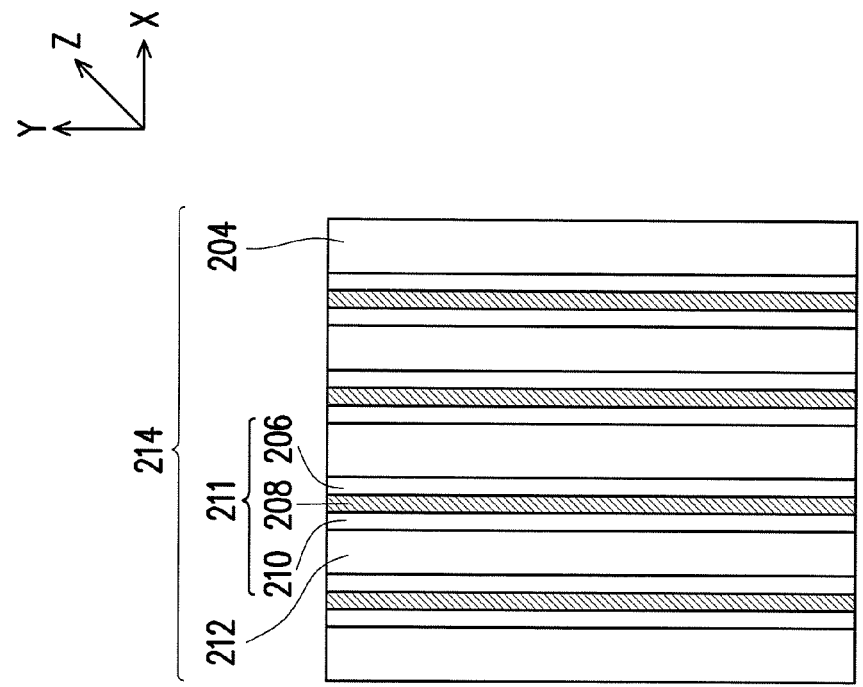
Figure 3E:
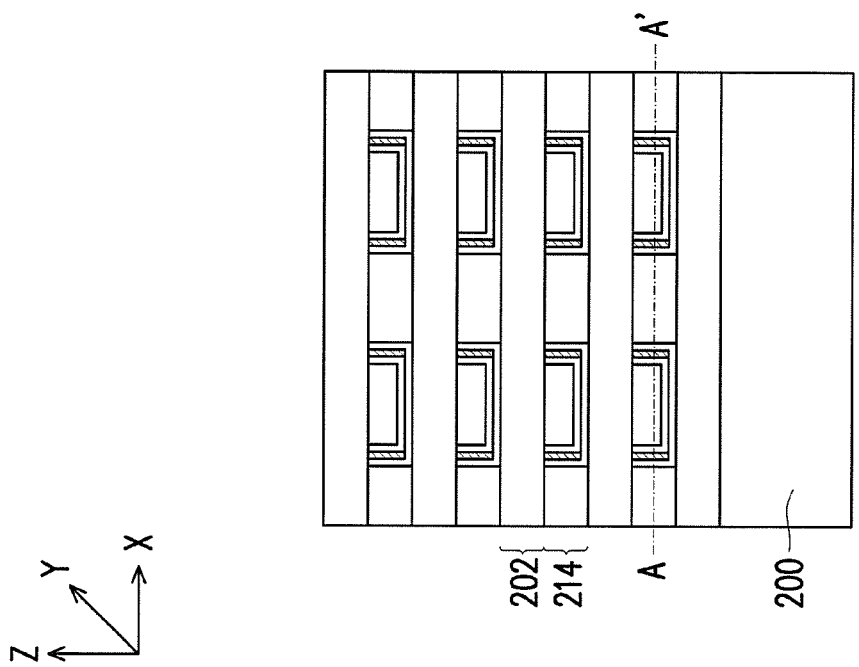

Referring to FIG. 3E and FIG. 4E, a plurality of insulation layers 202 and a plurality of stacked layers 214 are formed on the substrate 200 by repeating the steps of FIG. 3A (FIG. 4A) to FIG. 3D (FIG. 4D).

Referring to FIG. 3F and FIG. 4F, a plurality of holes 216 are formed at equal intervals along a Y direction in the sacrificial layer 212 of the stacked layer 214. The holes 216 extend along a Z direction, and penetrate through and a plurality of stacked layers 214 a plurality of insulation layers 202 and expose the sacrificial layer 212 of each stacked layer 214. The holes 216 are, for example, formed by the following steps. A patterned photoresist layer (not shown) is formed to define predetermined locations of the holes 216. The patterned photoresist layer is then used as a mask to remove the stacked layer 214 and the insulation layer 202 under the predetermined locations of the holes 216. The stacked layer 214 and the insulation layer 202 under the predetermined locations of the holes 216 are, for example, removed by a wet etching process or a dry etching process.

Referring to FIG. 3G and FIG. 4G, the sacrificial layers 212 of each of stacked layers 214 are removed by the holes 216 to form trenches 218, in which active layers will be formed later. The sacrificial layers 212 are, for example, removed by a wet etching process or a dry etching process.

Referring to FIG. 3H and FIG. 4H, a conductive layer 220 is formed on the substrate to fill the holes 216 and the trenches 218. The conductive layer 220 can include a conductive material, such as polycrystalline silicon or doped polycrystalline silicon. The conductive layer 220 is, for example, formed with a CVD process.

Figure 4I:
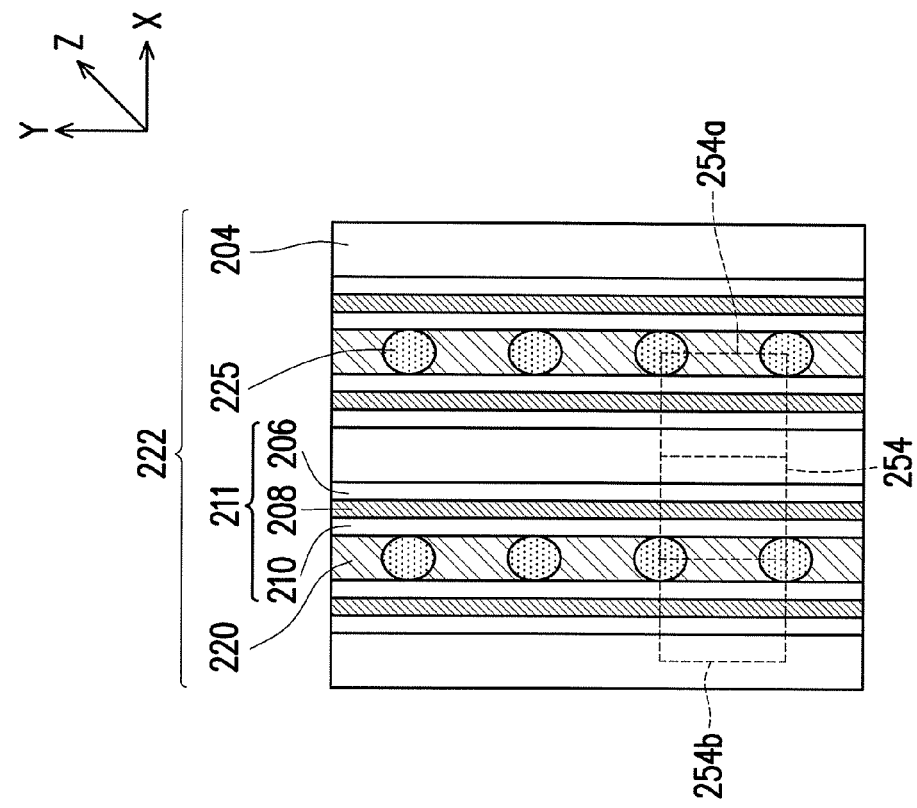
Figure 3I:
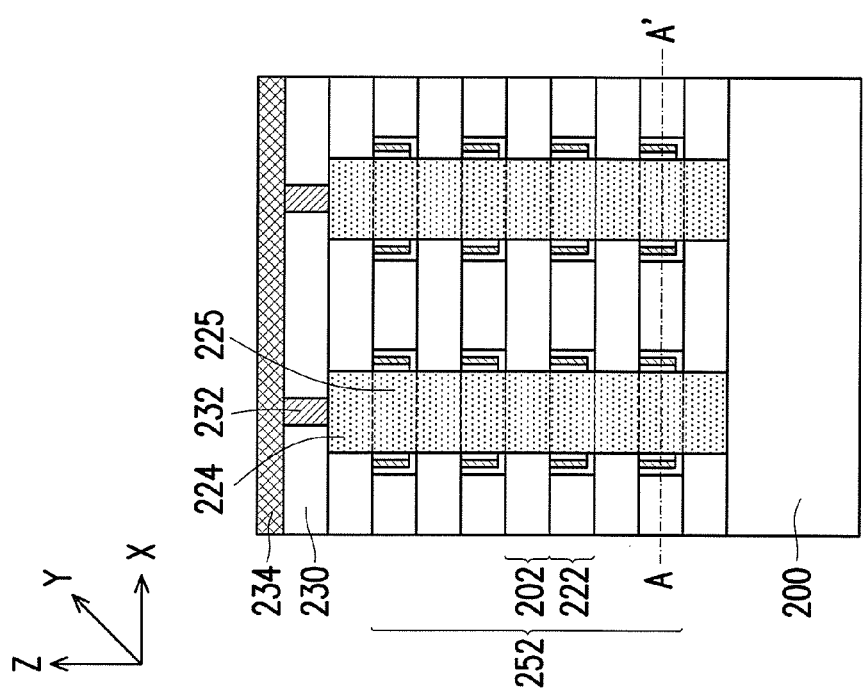

Referring to FIG. 3I and FIG. 4I, the conductive layer 220 in the holes 216 is removed. The conductive layer 220 in the holes 216 is, for example, removed by the following steps. First, a patterned photoresist layer (not shown) is formed to expose regions of the holes 216. The patterned photoresist layer is then used as a mask to remove the conductive layer 220 at the locations of the holes 216. The conductive layer 220 at the locations of the holes 216 is, for example, removed by a wet etching process or a dry etching process.

Conductive pillars 224 are formed in the holes 216. The conductive pillars 224 can include a conductive material, such as polycrystalline silicon, doped polycrystalline silicon, germanide, metal silicide or metal. The conductive pillars 224 are, for example, formed with a CVD process. A portion of the conductive pillars 224 in the memory cell array structures 222 are sources/drains 225.

A dopant of the conductive layer 220 is different from a dopant of the conductive pillars 224. For example, when the conductive layer 220 are polycrystalline silicon containing N-type dopant, the conductive pillars 224 are polycrystalline silicon containing P-type dopant; and when the conductive layer 220 are polycrystalline silicon containing P-type dopant, the conductive pillars 224 are polycrystalline silicon containing N-type dopant.

By now, a memory cell stacked structure 252 is formed. The memory cell stacked structure 252 is stacked by a plurality of memory cell array structures 222 and a plurality of insulation layers 202 alternatively. Each memory cell array structure 222 includes a plurality of word lines 204, a plurality of conductive layers 220, a plurality of composite layers 211, and a plurality of sources/drains 225. The composite layer 211 includes the dielectric layer 210, the charge storage layer 208 and the dielectric layer 206.

A memory cell 254 includes two adjacent sources/drains 225, the conductive layer 220 between the two adjacent sources/drains 225, and the dielectric layer 210, the charge storage layer 208, the dielectric layer 206 on the conductive layer 220 and the word lines 204. Among which, for example, the conductive layer 220 is an active layer, the dielectric layer 210 is a tunneling dielectric layer, the charge storage layer 208 is a floating gate, the dielectric layer 206 is an inter-gate dielectric layer, and the word line 204 is also a control gate of the memory cell.

Next, an interlayer insulation layer 230 is formed on the memory cell stacked structure 252. The interlayer insulation layer 230 is, for example, silicon oxide, phosphorosilicate glass, boron-phosphorosilicate glass, or other suitable dielectric materials. The interlayer insulation layer 230 is, for example, formed with a CVD process. Then, a plurality of plugs 232 are formed in the interlayer insulation layer 230, and the plugs 232 are each electrically connected with the conductive pillars 224. The plugs 232 can include a conductive material, such as polycrystalline silicon, doped polycrystalline silicon, metal silicide or metal.

The plugs 232 are formed in the interlayer insulation layer 230 by the following steps. First, a portion of the interlayer insulation layer 230 is removed to form a plurality of openings that each exposes the conductive pillars 224. Next, a conductive material layer (not shown) is formed on the substrate 200 to fill in the openings. Then, a portion of the conductive material layer is removed by a CMP process until the interlayer insulation layer 230 is exposed. The openings are, for example, formed by a photolithography and etching process.

Next, bit lines 234 are formed on the interlayer insulation layer 230. The bit lines 234 extend along an X direction, and are disposed to be parallel to each other. The bit lines 234 are electrically connected with the conductive pillars 224, and are electrically connected with the conductive pillars 224 on the X direction (referring to FIG. 1C). The bit lines 234 are, for example, polycrystalline silicon, doped polycrystalline silicon, metal silicide or metal. The bit lines 234 are, for example, formed by the following steps. First, a conductive material layer (not shown) is formed on the substrate 200, and the conductive material layer is then patterned to form bit lines 234. The conductive material layer is, for example, formed with a CVD process.

Figure 6A:
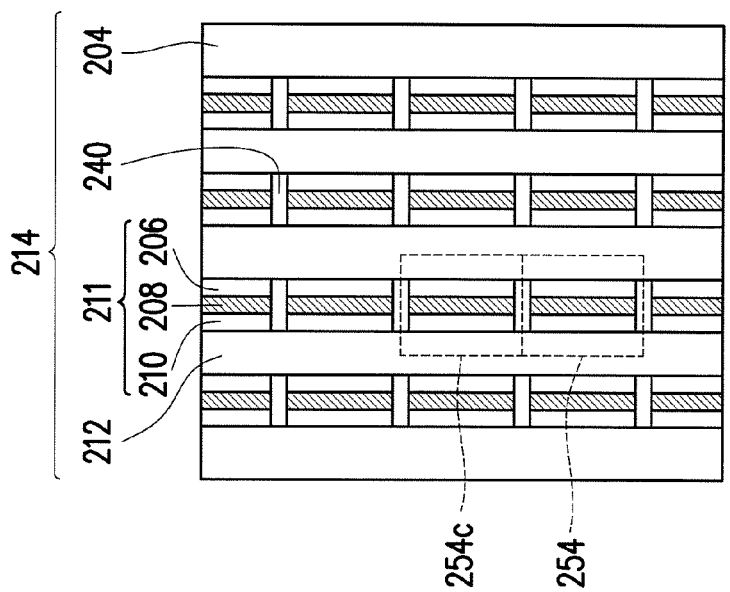
Figure 5A:
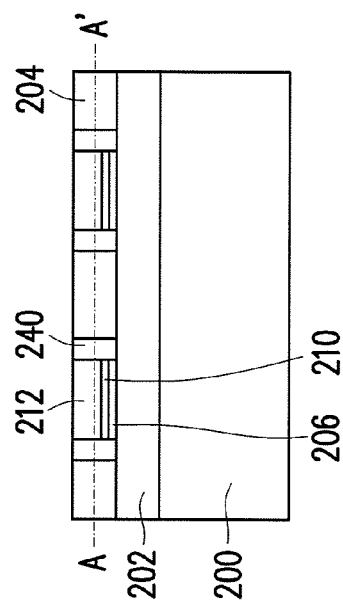

FIG. 5A and FIG. 5B are cross-sectional views illustrating a part of a manufacturing process of a three-dimensional memory according to another embodiment of the invention. FIG. 6A and FIG. 6B are cross-sectional views taken along the line A-A' of FIG. 5A and FIG. 5B.

The difference between another embodiment and the abovementioned embodiment is that: after the step of FIG. 3D and FIG. 4D, a step of FIG. 5A and FIG. 5B is added. The steps after are the same as the steps of the abovementioned embodiment.

Referring to FIG. 5A and FIG. 6A, a plurality of isolation layers 240 are formed at equal intervals along a Y direction in the charge storage layer 208 of the stacked layer 214. The isolation layer 240 isolates the charge storage layers 208 of the adjacent memory cells (for example, memory cell 254 and memory cell 254c in FIG. 6A). The isolation layers 240 can include silicon oxide. The isolation layers 240 are, for example, formed by the following steps. First, a patterned photoresist layer (not shown) is formed to define predetermined locations of the isolation layers 240. The patterned photoresist layer is then used as a mask to remove the charge storage layer 208 under the predetermined locations of the isolation layers 240. Next, an isolation material layer (not shown) is filled, and a portion of the isolation material layer is removed by a CMP process until the word lines 204 are exposed to form the isolation layers 240. The isolation material layer is, for example, filled with a CVD process.

Referring to FIG. 5B and FIG. 6B, a remaining charge storage layer 208 is removed, and a charge storage layer 242 is filled to the former location of the charge storage layer 208. The charge storage layer 242 is, for example, polycrystalline silicon or doped polycrystalline silicon. The remaining charge storage layer 208 is, for example, removed by a dry etching process or a wet etching process. The charge storage layer 242 is, for example, filled by filling a trapping material layer (not shown) to the former location of the charge storage layer 208, and remove a portion of the trapping material layer by a CMP process until the word lines 204 are exposed to form the charge storage layer 242. The trapping material layer is, for example, filled with a CVD process.

In summary, in the three-dimensional memory of the invention, two adjacent memory cells share one word line (such as memory cell 254 and memory cell 254a in FIG. 4I) or one active layer and sources/drains (such as memory cell 254 and memory cell 254b in FIG. 4I), thus an integration of elements can be elevated.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A three-dimensional memory, comprising:
   memory cell stacked structures, stacked by a plurality of memory cell array structures and a plurality of insulation layers alternatively, and each memory cell array structure comprising:
   a plurality of word lines, extending along a Y direction;
   a plurality of active layers, extending along the Y direction and disposed between the adjacent word lines;
   a plurality of composite layers, extending along the Y direction and disposed between the adjacent word lines and the adjacent active layers, wherein each composite layer comprises a first dielectric layer, a charge storage layer and a second dielectric layer in sequence from the active layer; and
   a plurality of sources/drains, disposed in the active layers at equal intervals, wherein a memory cell comprises two adjacent sources/drains, the active layer between the two adjacent sources/drains, and the first dielectric layer, the charge storage layer and the second dielectric layer on the active layer, and the word lines.

2. The three-dimensional memory according to claim 1, further comprising a plurality of conductive pillars, extending along a Z direction and electrically connected with the sources/drains in the memory cell stacked structures.

3. The three-dimensional memory according to claim 1, further comprising a plurality of bit lines, extending along an X direction and electrically connected with the conductive pillars on the X direction.

4. The three-dimensional memory according to claim 3, wherein the bit lines comprises polycrystalline silicon, doped polycrystalline silicon, metal silicide or metal.

5. The three-dimensional memory according to claim 1, wherein the charge storage layers comprises silicon nitride, polycrystalline silicon or doped polycrystalline silicon, and the three-dimensional memory further comprises a plurality of isolation layers, disposed in the charge storage layers to isolate the charge storage layers of the adjacent memory cells.

6. The three-dimensional memory according to claim 1, wherein the word lines and the active layers each comprise polycrystalline silicon or doped polycrystalline silicon.

7. The three-dimensional memory according to claim 1, wherein the sources/drains and the conductive pillars comprise polycrystalline silicon, doped polycrystalline silicon, germanide, metal silicide or metal.

8. The three-dimensional memory according to claim 1, wherein the first dielectric layers, the second dielectric layers and the insulation layers each comprises silicon oxide.

9. The three-dimensional memory according to claim 1, wherein in each memory cell stacked structure, two adjacent memory cells share one word line, or share one active layer and sources/drains on the X direction.

10. The three-dimensional memory according to claim 1, wherein in each memory cell stacked structure, a plurality of the memory cells are connected in series and share one word line on the Y direction.

* * * * *